US006717068B2

United States Patent
Motonishi et al.

(10) Patent No.: US 6,717,068 B2
(45) Date of Patent: Apr. 6, 2004

(54) CIRCUIT BOARD CAPABLE OF PREVENTING ELECTROSTATIC BREAKDOWN AND MAGNETIC HEAD USING THE SAME

(75) Inventors: Michiharu Motonishi, Niigata-ken (JP); Michiaki Moroe, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/264,230

(22) Filed: Oct. 2, 2002

(65) Prior Publication Data

US 2003/0035252 A1 Feb. 20, 2003

Related U.S. Application Data

(62) Division of application No. 09/629,804, filed on Jul. 31, 2000.

(30) Foreign Application Priority Data

Aug. 2, 1999 (JP) .......................................... 11-219361

(51) Int. Cl.[7] .......................... H01R 12/04; H05K 1/11
(52) U.S. Cl. ...................... 174/261; 174/262; 174/267; 361/792; 360/323
(58) Field of Search .............................. 174/254, 255, 174/261, 260, 803, 250, 262, 267; 361/792, 760, 783, 748, 749; 360/323; 257/737, 738, 778, 690, 692

(56) References Cited

U.S. PATENT DOCUMENTS

| | | | |
|---|---|---|---|
| 3,770,874 A | * | 11/1973 | Krieger et al. ............... 174/257 |
| 5,699,212 A | * | 12/1997 | Erpelding et al. ........ 360/245.8 |
| 5,759,428 A | * | 6/1998 | Balamane et al. ...... 219/121.66 |
| 6,373,709 B1 | * | 4/2002 | Hino et al. .................. 361/749 |

FOREIGN PATENT DOCUMENTS

| | | |
|---|---|---|
| JP | 7-141636 | 6/1995 |
| JP | 11-312310 | 11/1999 |

* cited by examiner

Primary Examiner—Kamand Cuneo
Assistant Examiner—I B Patel
(74) Attorney, Agent, or Firm—Brinks Hofer Gilson & Lione

(57) ABSTRACT

The invention provides a magnetic head capable of positively preventing electrostatic breakdown of an MR magnetic head device, and a method of manufacturing the magnetic head. A circuit board comprises at least a pair of leads for constructing a circuit, lands connected respectively to the leads, and solder bumps formed respectively on the lands. The solder bumps are arranged in an adjacent relationship and, when the solder bumps are crushed, peripheral portions of the solder bumps are pressed or spread so as to overlap with each other. The magnetic head includes the circuit board.

5 Claims, 9 Drawing Sheets

AFTER 1.0 SEC

AFTER 1.5 SEC

AFTER 2.0 SEC

AFTER 2.5 SEC

CIRCUIT BOARD CAPABLE OF PREVENTING ELECTROSTATIC BREAKDOWN AND MAGNETIC HEAD USING THE SAME

This application is a division of application Ser. No. 09/629,804, filed Jul. 31, 2000, which is hereby incorporated by reference herein.

BACKGROUND OF THE INVENTION

1. Field of the Invention

The present invention relates to a circuit board, and a magnetic head incorporating the circuit board. More particularly, the present invention relates to a circuit board capable of protecting an MR magnetic head device, which incorporates the circuit board, against electrostatic breakdown.

2. Description of the Related Art

An example of a conventional magnetic head 201 for use in a computer hard disk is shown in FIG. 17. The magnetic head 201 generally comprises a slider 203, a load beam 202, and a circuit board 204. The slider 203 is attached to a fore end 202a of the load beam 202 through a flexure, and a base plate 209 is attached to an opposite end 202b of the load beam 202. The circuit board 204 is attached to the base plate 209.

The slider 203 includes an MR magnetic head device 208 for reproducing magnetically recorded data, and an inductive head device (not shown) for recording data to be magnetically recorded. From each of these head devices, two lead lines are extended to transmit and receive a reproduced signal and a recording signal to and from the outside of the magnetic head. These four lead lines 205a, 205b, 206a, 206b are connected to the circuit board 204 at the side of the base plate 209 where it is attached to the opposite end 202b of the load beam 202.

The circuit board 204 is formed of a flexible printed board, and includes four leads 215a, 215b, 216a, 216b connected respectively to the lead lines extended from the head devices (i.e., 205a, 205b, 206a, 206b). Mounting terminals 215c, 215d, 216c, 216d are provided respectively midway on the leads 215a, 215b, 216a, 216b. Inspection terminals 215e, 215f, 216e, 216f are provided respectively at ends of the leads 215a, 215b, 216a, 216b.

The leads 215a, 215b, that are connected to the lead lines 205a, 205b of the MR magnetic head device 208, include lands 223, 224 provided between the mounting terminals 215c, 215d and the inspection terminals 215e, 215f, respectively.

In a conventional magnetic head of this type, the circuit including the MR magnetic head device 208 is typically constructed as a closed circuit by attaching a shunt clip or forming a bonding wire between the lands 223, 224 so as to short the lands 223, 224 together. This is done to prevent electrostatic breakdown of the MR magnetic head device 208 during a period from manufacture of the magnetic head to assembly thereof into a hard disk drive.

This may result in a number of problems. For example, when the lands 223, 224 are shorted together by using a clip, there is a risk that the clip may slip off as result of vibration during transport of the magnetic head. As a result, the MR magnetic head device 208 may suffer electrostatic breakdown.

Also, shorting the lands 223, 224 together by wire bonding requires that a wire-bonding step be included in the manufacturing process of the magnetic head, thereby resulting in an increased production cost of the magnetic head.

In view of the state of the art set forth above, an object of the present invention is to provide a magnetic head capable of positively preventing electrostatic breakdown of an MR magnetic head device, and a method of manufacturing the magnetic head, that overcomes the above-identified problems.

SUMMARY OF THE INVENTION

The present invention is directed to a circuit board comprising at least a pair of leads for constructing a circuit, lands connected respectively to the pair of leads, and solder bumps formed respectively on the lands, wherein the solder bumps are arranged in an adjacent relationship. The solder bumps are subsequently crushed, causing peripheral portions of the solder bumps to spread and overlap with each other.

The present invention is also directed to a circuit board comprising at least a pair of leads for constructing a circuit, lands formed for connection respectively to the pair of leads, and a solder bridge for electrically interconnecting the lands, wherein the solder bridge is formed by peripheral portions of the solder bumps formed on the lands so that portions of the solder bumps overlap with each other. Preferably, the solder bridge is formed by crushing the solder bumps formed on the lands to an extent that crushed peripheral portions of the solder bumps are overlapped with each other.

Consequently, the leads constructing the circuit on the circuit board can be easily shorted together by crushing the solder bumps, and the circuit can be formed into a closed circuit.

Moreover, since the solder bridge is formed by the peripheral portions of the solder bumps which are integrally overlapped with each other, the contact area between the solder bumps is increased and the leads can be positively shorted between them.

Further, the present invention is directed to a circuit shorting method for a circuit board comprising at least a pair of leads for constructing a circuit, lands connected respectively to the pair of leads, and solder bumps formed on the lands and positioned adjacent to each other. The method comprises the steps of crushing one of the solder bumps such that a peripheral portion of the one solder bump is pressed to spread outward in a radial direction to approach the other solder bump; and then crushing the other solder bump such that a peripheral portion of the other solder bump is pressed to spread outward in a radial direction to contact with the peripheral portion of the one solder bump, whereby the pair of leads are shorted.

With this circuit shorting method, two solder bumps are contacted with each other by crushing the solder bumps one by one. Therefore, the solder bumps can be each positively crushed to make the leads shorted between them, and the circuit can be positively formed into a closed circuit.

In the above circuit shorting method, the step of crushing the other solder bump is preferably performed until a part of the peripheral portion of the other solder bump overlaps the peripheral portion of the one solder bump.

One feature of this circuit shorting method is that the pair of solder bumps are contacted with each other in an overlapping relation. Thus, the solder bumps are unlikely to be separated, even when the circuit board is bent or flexed. Further, a contact area between the solder bumps is increased and the pair of leads can be positively shorted between them.

In the above circuit shorting method, the solder bumps are preferably each crushed under heating. Heating of the solder bumps causes them to soften, thereby reducing the load required for crushing the solder bumps, and the solder bumps can be positively crushed without damaging the circuit board itself.

In the above circuit shorting method, the pair of solder bumps may be crushed simultaneously underheating. Crushing the solder bumps simultaneously, while being softened under heating, reduces the load required for crushing the solder bumps, and the pair of solder bumps can be positively contacted with each other even when they are crushed simultaneously. Additionally, damage of the circuit board itself can be avoided.

In the above circuit shorting method, the solder bumps are preferably each crushed under heating and rubbing. By heating and rubbing the solder bumps, each solder bump is caused to spread in the planar direction of the circuit board while being crushed. This causes the solder bumps to be more positively contacted with each other.

The present invention is directed to a magnetic head in which a slider including an MR magnetic head device is attached to a fore end of a load beam, a circuit board is attached to an opposite end of the load beam, and a pair of lead lines extended from the MR magnetic head device are connected to the circuit board. The circuit board comprises at least a pair of leads connected respectively to the lead lines and constructing a circuit including the MR magnetic head device in cooperation with the lead lines, lands connected respectively to the leads, and solder bumps formed respectively on the lands. The solder bumps are arranged in an adjacent relationship and, when the solder bumps are crushed, peripheral portions of the solder bumps are pressed to spread and overlap with each other.

The present invention is also directed to a magnetic head in which a slider including an MR magnetic head device is attached to a fore end of a load beam, a circuit board is attached to an opposite end of the load beam, and a pair of lead lines extended from the MR magnetic head device are connected to the circuit board. The circuit board comprises at least a pair of leads connected respectively to the lead lines and constructing a circuit including the MR magnetic head device in cooperation with the lead lines, lands connected respectively to the leads, and a solder bridge for electrically interconnecting the lands. The solder bridge is formed by peripheral portions of the solder bumps formed respectively on the leads and overlapped with each other. The solder bridge is preferably formed by crushing the solder bumps formed on the lands to an extent that crushed peripheral portions of the solder bumps are overlapped with each other.

With respect to the MR magnetic head device, a circuit is constructed with the lead lines extended from the head device and the pair of leads connected to the lead lines. The circuit can be easily formed into a closed circuit by crushing the solder bumps so that the pair of leads are shorted between them. As a result, the MR magnetic head device can be protected against electrostatic breakdown.

The present invention is directed to a method of manufacturing a magnetic head in which a slider including an MR magnetic head device is attached to a fore end of a load beam and a circuit board is attached to an opposite end of the load beam. The circuit board comprises at least a pair of leads connected to the MR magnetic head device, lands connected respectively to the pair of leads, and solder bumps formed respectively on the lands and positioned adjacent to each other The method comprises the steps of crushing one of the solder bumps such that a peripheral portion of the one solder bump is spread outward in a radial direction to approach the other solder bump; and then crushing the other solder bump such that a peripheral portion of the other solder bump is likewise spread outward in a radial direction to contact with the peripheral portion of the one solder bump, whereby the pair of leads are shorted.

With this method of manufacturing a magnetic head, a circuit is constructed by the MR magnetic head device, the lead lines extended from the head device and the pair of leads connected to the lead lines. The circuit is formed into a closed circuit by crushing the solder bumps so that the pair of leads are shorted between them. Therefore, the MR magnetic head device can be protected against electrostatic breakdown.

In the above method of manufacturing a magnetic head, the step of crushing the other solder bump is preferably performed until a part of the peripheral portion of the other solder bump overlaps the peripheral portion of the one solder bump. Since the pair of solder bumps are contacted with each other in an overlapping relationship, the contact area between the solder bumps is increased and the pair of leads can be more positively shorted together, whereby the circuit including the MR magnetic head device can be formed into a closed circuit.

In the above described method of manufacturing a magnetic head, the solder bumps are each preferably crushed under heating. Heating softens the solder bumps, thereby reducing the load required for crushing the solder bumps, and the solder bumps can be crushed without damaging the circuit board itself.

In the above described method of manufacturing a magnetic head, the pair of solder bumps may be crushed simultaneously under heating. Crushing the solder bumps simultaneously while they are being softened under heating, reduces the load required for crushing the solder bumps, and the pair of solder bumps can be positively contacted with each other even when they are crushed simultaneously. Damage of the circuit board can consequently be avoided.

In the above described method of manufacturing a magnetic head, the solder bumps are each preferably crushed under heating and rubbing. By heating and rubbing the solder bumps as they are each crushed, each solder bump is spread in the planar direction of the circuit board while being crushed, which causes the solder bumps to be more positively contacted with each other.

DESCRIPTION OF THE PREFERRED EMBODIMENTS

Embodiments of the present invention will be described below with reference to the drawings.

Figure 1:
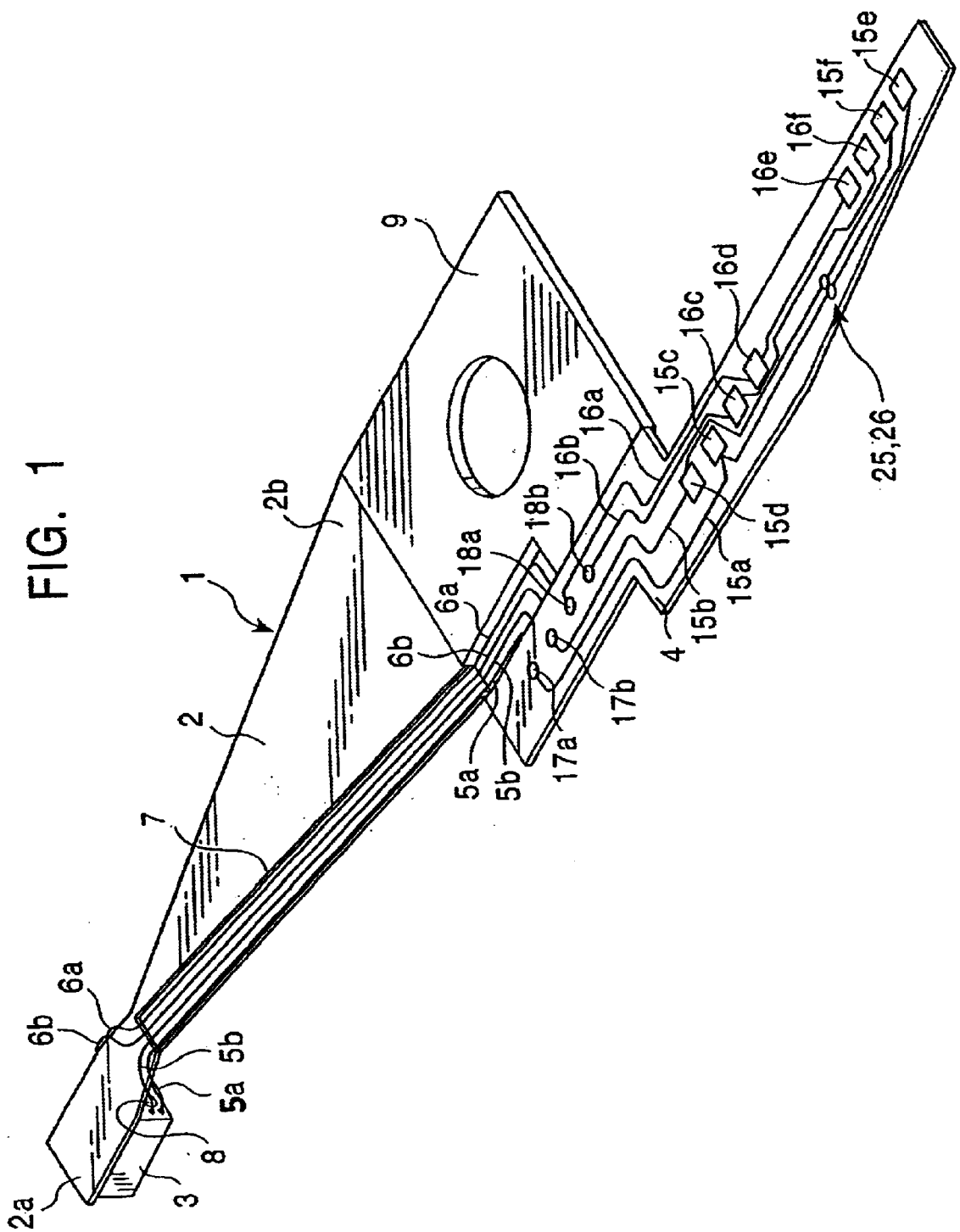
FIG. 1 is a perspective view of a magnetic head according to an embodiment of the present invention.

FIG. 1 shows a magnetic head 1 according to the present invention. The magnetic head 1 mainly comprises a load beam 2, a slider 3 attached to a fore end 2a of the load beam 2, and a circuit board 4 of the present invention attached to a base plate 9. The base plate 9 is attached to a base (opposite) end 2b of the load beam 2.

The slider 3 includes an MR magnetic head device 8 serving as a reproducing head and an inductive head device (not shown) serving as a recording head, these head devices being provided on one end surface of the slider 3.

One pair of lead lines 5a, 5b are extended from the MR magnetic head device 8, and another pair of lead lines 6a, 6b are extended from the inductive head device.

The lead lines 5a, 5b, 6a, 6b are collected together by a flexible printed circuit (FPC) board 7 on the upper surface of the load beam 2. The FPC board 7 extends to the base plate 9 (attached to the opposite end 2b of the load beam 2).

The circuit board 4 is connected to the FPC board 7 through connection terminals 17a, 17b, 18a, 18b. The circuit board 4 is attached to the base plate 9 in an overlapped relationship to an end portion of the FPC board 7.

Figure 2:
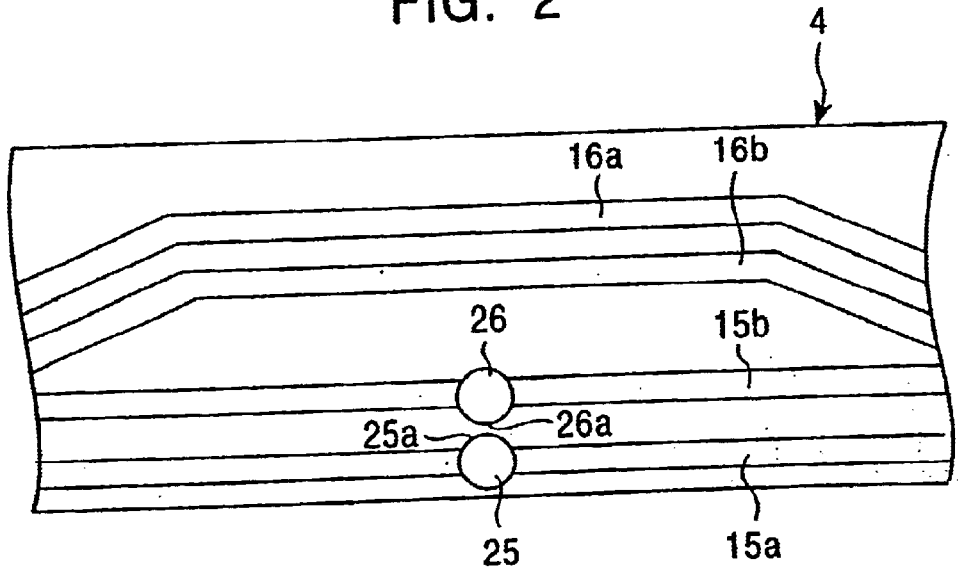
FIG. 2 is a plan view showing a principal part of a circuit board provided on the magnetic head shown in FIG. 1.
Figure 3:
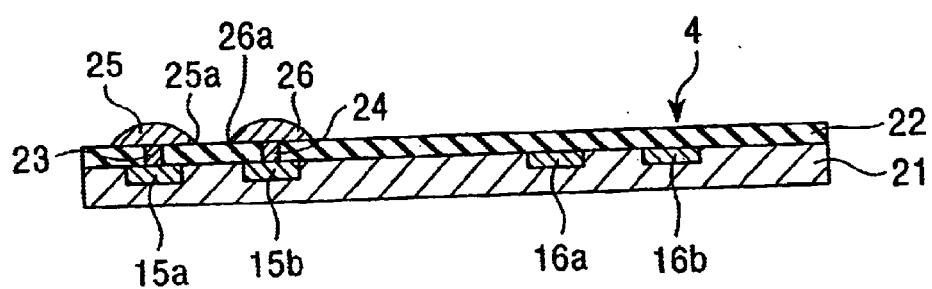
FIG. 3 is a sectional view of the principal part of the circuit board shown in FIG. 2.

The circuit board 4 of the present invention comprises, as shown in FIGS. 1 to 3, a substrate 21 and an insulating layer 22 formed over the substrate 21. Four leads 15a, 15b, 16a, 16b are formed on the substrate 21 and are covered by the insulating layer 22. Also, as shown in FIG. 1, the leads 15a, 15b, 16a, 16b are connected to the connection terminals 17a, 17b, 18a, 18b, respectively.

Further, as shown in FIG. 1, the leads 15a, 15b, 16a, 16b include mounting terminals 15c, 15d, 16c, 16d and inspection terminals 15e, 15f, 16e, 16f provided thereon.

At the juncture (i.e., overlapped portion) between the circuit board 4 and the FPC board 7, the connection terminals 17a, 17b, 18a, 18b of the circuit board 4 are connected respectively to four connection terminals (not shown) of the FPC board 7.

As set forth in the above-described arrangement, the lead 15a is connected to the lead line 5a through the connection terminal 17a, and the lead 15b is connected to the lead line 5b through the connection terminal 17b. Similarly, the lead 16a is connected to the lead line 6a through the connection terminal 18a, and the lead 16b is connected to the lead line 6b through the connection terminal 18b.

Thus, the MR magnetic head device 8, the lead lines 5a, 5b and the leads 15a, 15b cooperatively construct or form a circuit.

Lands 23, 24 are formed on the leads 15a, 15b (which forms the circuit including the MR magnetic head device 8) between the mounting terminals 15c, 15d and the inspection terminals 15e, 15f, respectively, as shown in FIGS. 2 and 3. Solder bumps 25, 26, being substantially circular in plan view, are formed on the lands 23, 24, respectively. The lands 23, 24 are formed as conductors positioned on the leads 15a, 15b, and projecting through the insulating layer 22. The solder bumps 25, 26 are formed respectively on the lands 23, 24 and are electrically connected to the leads 15a, 15b.

In the preferred embodiment, the solder bumps 25, 26 are formed from a solder made of, e.g., an SnPb alloy, and has a melting point preferably in the range of about 180° C.–185° C., taking into account that the solder bump is required to be easily crushed.

The solder bumps 25, 26 are preferably arranged adjacent to each other and with a distance left between them that, when crushed, their peripheral portions 25a, 26a are spread outward in the radial direction to allow interconnection between the solder bumps 25 and 26. More specifically, assuming that the solder bumps 25, 26 each have a diameter of 0.29–0.34 mm, the center-to-center distance between the solder bumps 25 and 26 is preferably in the range of 0.39–0.41 mm. If the center-to-center distance is less than 0.39 mm, there is a risk that the solder bumps 25, 26 may contact with each other when they are formed. Conversely, if the center-to-center distance is more than 0.41 mm, there is a risk that the solder bumps 25, 26 may not contact with each other even after they are crushed.

Figure 4:
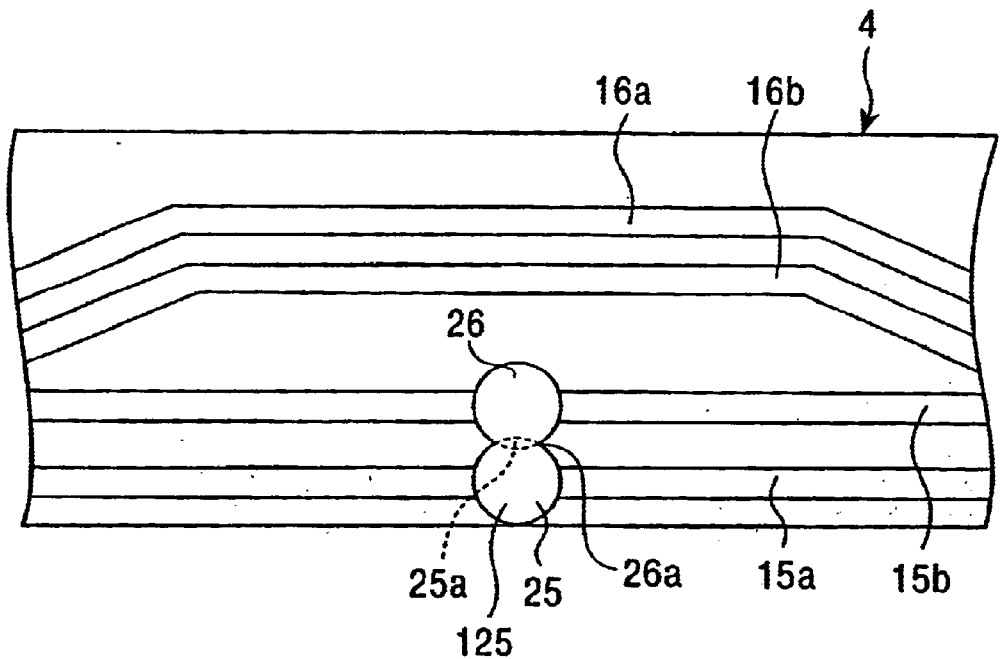
FIG. 4 is a plan view showing the principal part of the circuit board provided on the magnetic head shown in FIG. 1.
Figure 5:
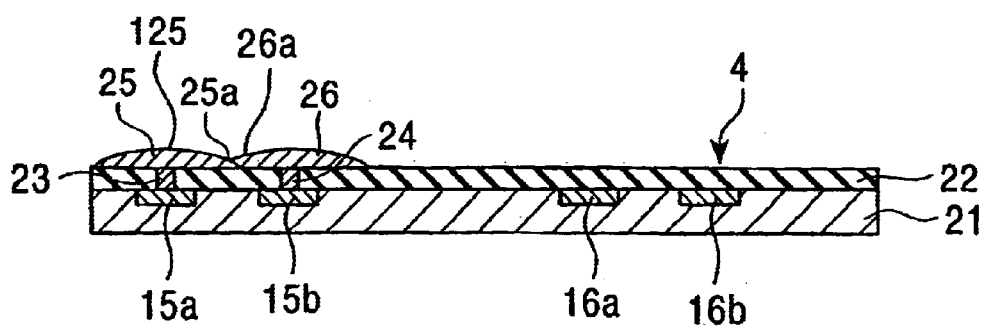
FIG. 5 is a sectional view of the principal part of the circuit board shown in FIG. 4.

FIGS. 4 and 5 show the solder bumps 25, 26 of the circuit board 4 after being crushed according to the present invention. When the solder bumps 25, 26 are crushed, the peripheral portions 25a, 26a of the solder bumps 25, 26 are caused to spread into an integrally overlapped relationship, thereby forming a solder bridge 125. The solder bridge 125 electrically connects the lands 23, 24 to each other for the purpose of shorting the leads 15a, 15b together so that the circuit including the MR magnetic head device 8 is formed into a closed circuit.

A method of manufacturing the magnetic head of the present invention will now be described with reference to the drawings.

First, the slider 3, including the MR magnetic head device 8 and the inductive head device (not shown), is attached to the fore end 2a of the load beam 2. The lead lines 5a, 5b, 6a, 6b are extended from the MR magnetic head device 8 and the inductive head device up to the base end 2b of the load beam 2 through the FPC board 7.

Then, the circuit board 4 is attached to the base end 2b of the load beam 2. At this time, the lead lines 5a, 5b, 6a, 6b are connected to the leads 15a, 15b, 16a, 16b, respectively, of the circuit board 4 through the connection terminals 17a, 17b, 18a, 18b. Accordingly, the MR magnetic head device 8, the lead lines 5a, 5b and the leads 15a, 15b are interconnected to form or construct a circuit.

Figure 6:
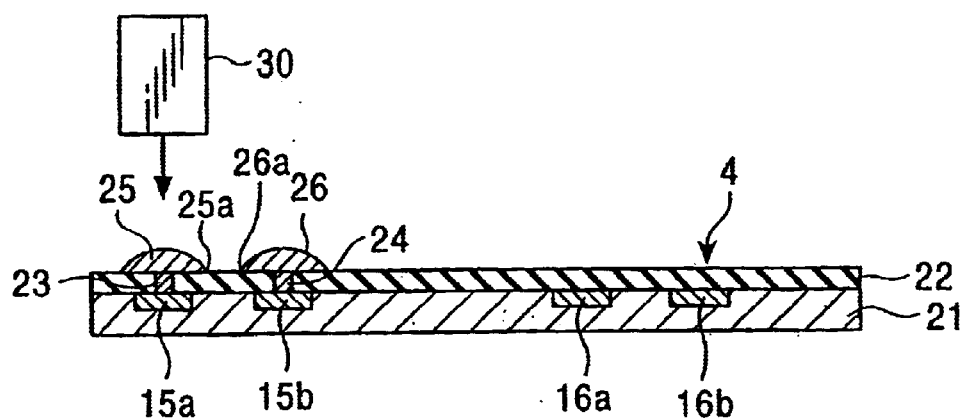
FIG. 6 is a sectional view depicting a step of a method of manufacturing the magnetic head according to an embodiment of the present invention.
Figure 7:
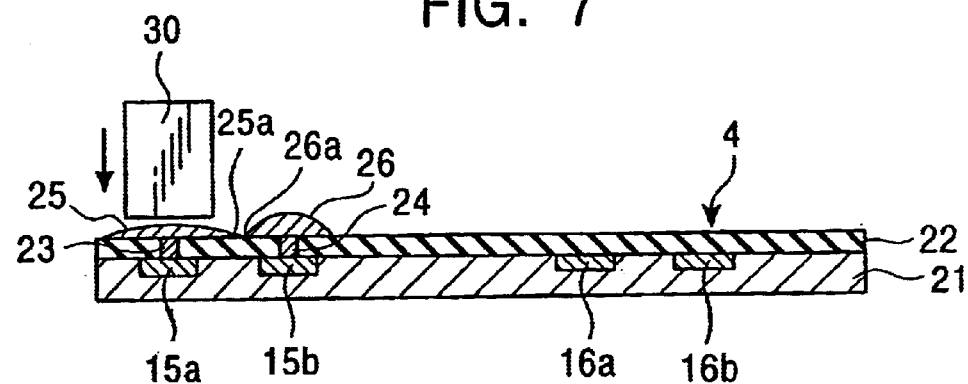
FIG. 7 is a sectional view depicting a step of a method of manufacturing the magnetic head according to the embodiment of the present invention.

Then, as shown in FIG. 6, a pressing tip 30 is prepared and pressed against the first solder bump 25, whereupon the solder bump 25 is crushed as shown in FIG. 7. As a result of this crushing, the peripheral portion 25a of the solder bump 25 is pressed or spread outward in the radial direction so as to approach the other or second solder bump 26.

Figure 8:
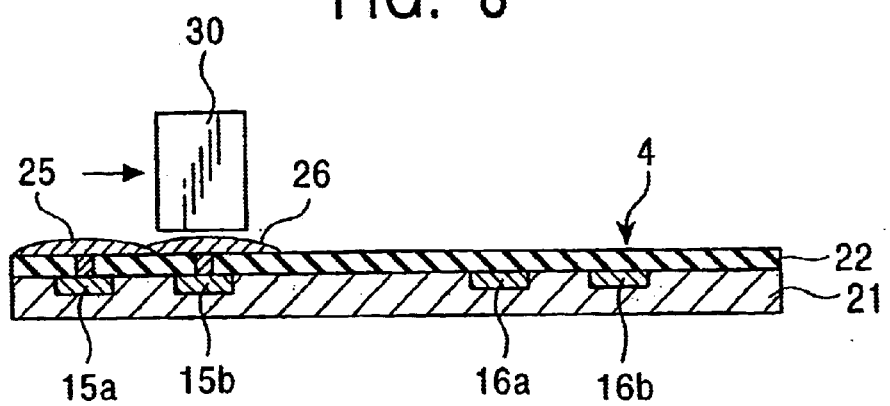
FIG. 8 is a sectional view depicting a step of a method of manufacturing the magnetic head according to the embodiment of the present invention.

Then, as shown in FIG. 8, the pressing tip 30 is pressed against the other or second solder bump 26, whereupon the solder bump 26 is crushed. The peripheral portion 26a of the solder bump 26 is thereby pressed or spread outward in the radial direction until the peripheral portion 26a overlaps the peripheral portion 25a of the first solder bump.

When the solder bumps 25, 26 contact with each other, the leads 15a, 15b are shorted together or between them and the circuit including the MR magnetic head device 8 is formed into a closed circuit.

Figure 9:
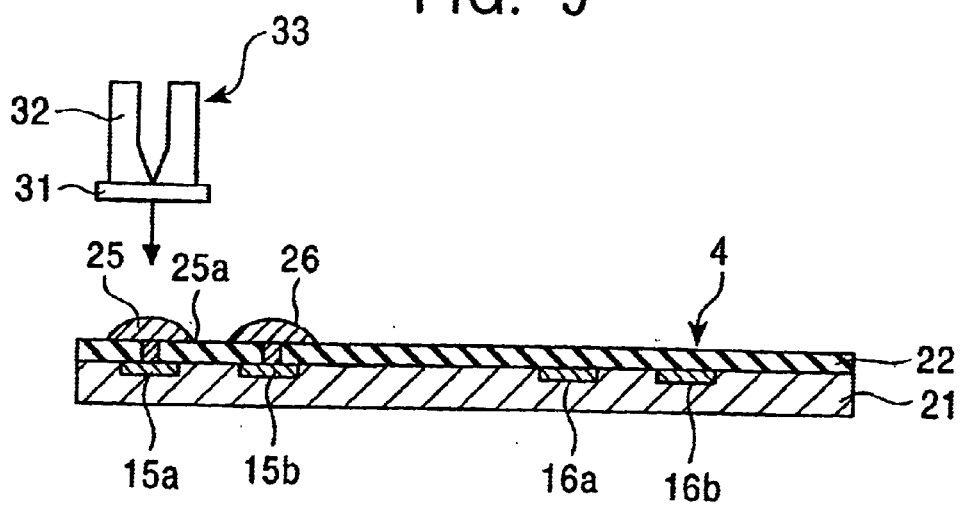
FIG. 9 is a sectional view depicting a step of a first alternative method of manufacturing the magnetic head according to an embodiment of the present invention.
Figure 10:
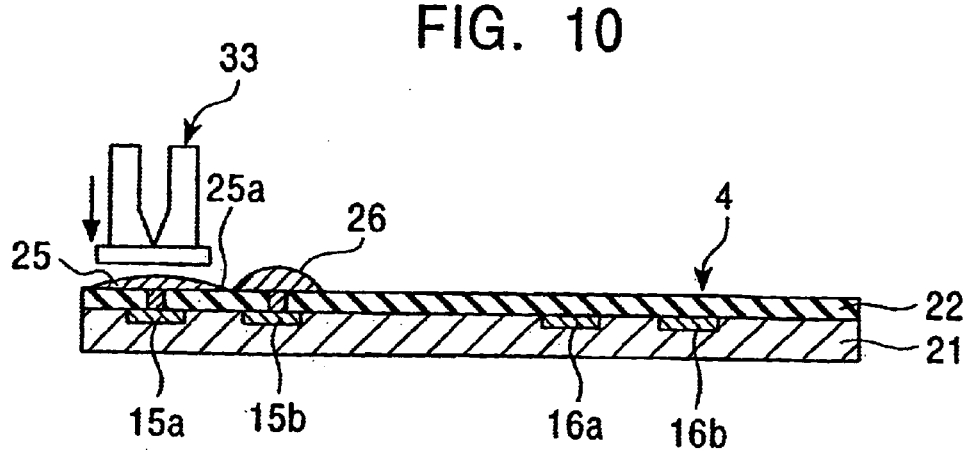
FIG. 10 is a sectional view depicting a step of the first alternative method of manufacturing the magnetic head according to the embodiment of the present invention.
Figure 11:
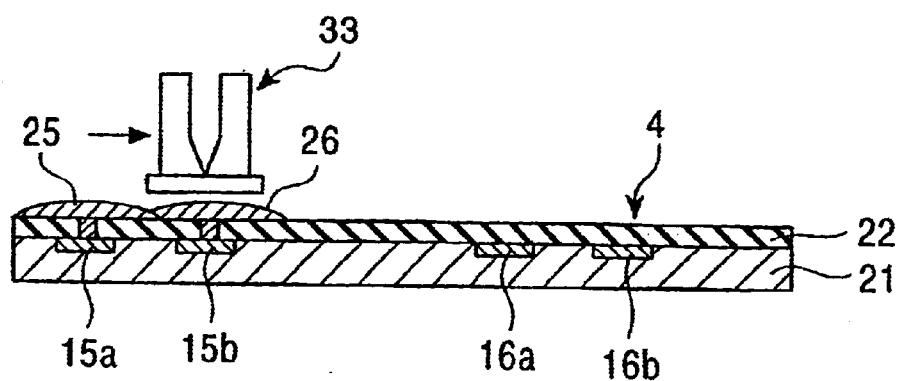
FIG. 11 is a sectional view depicting a step of the first alternative method of manufacturing the magnetic head according to the embodiment of the present invention.

An alternative method for crushing the solder bumps 25, 26 is shown in FIGS. 9–11. Instead of the pressing tip 30 (as described above), a heater tip 33 comprising a heat-resistant resin film 31 and a heater 32 attached to the film 31 is utilized. The heater tip 33 is pressed against the first solder bump 25 while heating the same, whereupon the solder bump 25 is crushed as shown in FIG. 10. As a result of the crushing, the peripheral portion 25a of the solder bump 25 is pressed or spread outward in the radial direction so as to approach the other or second solder bump 26.

Then, as shown in FIG. 11, the heater tip 33 is pressed against the other or second solder bump 26 while heating the same, whereupon the solder bump 26 is crushed. The peripheral portion 26a of the solder bump 26 is thereby pressed or spread outward in the radial direction until the peripheral portion 26a overlaps the peripheral portion 25a of the first solder bump 25.

As the solder bumps 25, 26 contact each other, the leads 15a, 15b are shorted together or between them, and the circuit including the MR magnetic head device 8 is formed into a closed circuit.

In the case of crushing the solder bumps 25, 26 by the heater tip 33, it is preferable that the heating temperature of the solder bumps 25, 26 be set to 170–210° C., and more preferably 175–185° C. The preferred heating time is 1.5–2.5 seconds, and more preferably 1.5–2.0 seconds.

If the heating temperature is lower than 170° C., then the solder may not be sufficiently softened, thereby preventing the solder bumps 25, 26 from contacting with each other, or that a too large of a load must be applied to crush the solder bumps 25, 26, which can cause the circuit board 4 to be damaged. If the heating temperature is higher than 210° C., then there is a risk that the solder bumps 25, 26 are completely melted into a liquid state, and when crushed, parts of the solder may scatter around the solder bumps 25, 26 upon collapse of the bump shapes.

Further, if the heating time is shorter than 1.5 seconds, there is a risk that the solder will not be sufficiently softened to permit the solder bumps 25, 26 to contact with each other upon crushing. If the heating time is longer than 2.5 seconds, then there is a risk that the solder bumps 25, 26 will completely melted into a liquid state, and when crushed, parts of the solder may scatter around the solder bumps 25, 26 upon collapse of the bump shapes.

Figure 12:
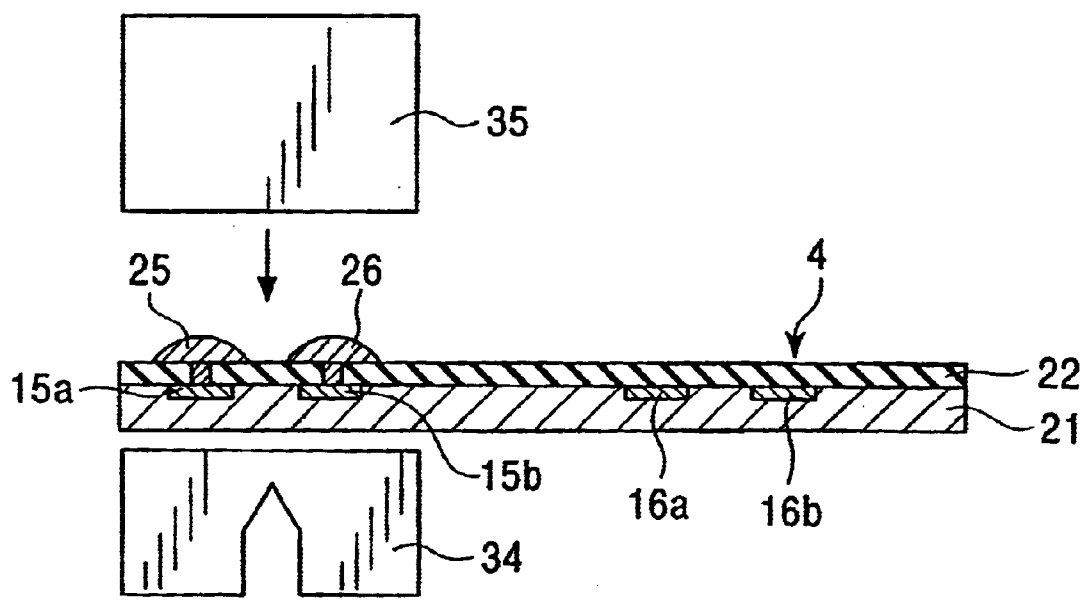
FIG. 12 is a sectional view depicting a step of a second alternative method of manufacturing the magnetic head according to an embodiment of the present invention.
Figure 13:
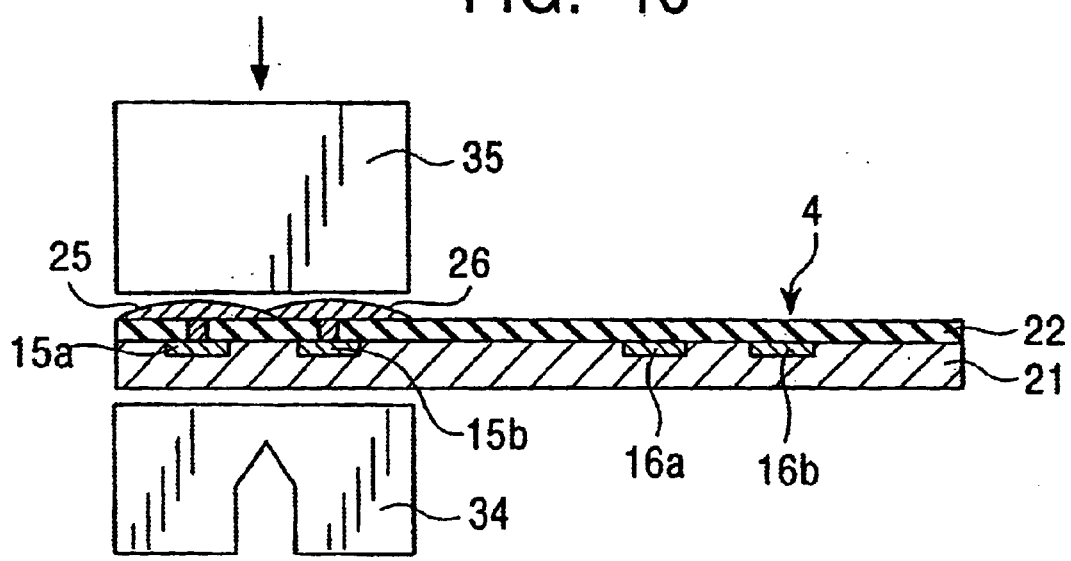
FIG. 13 is a sectional view depicting a step of the second alternative method of manufacturing the magnetic head according to the embodiment of the present invention.

Another alternative method for crushing the solder bumps 25, 26 is shown in FIGS. 12–13. A pressing tip 35 that is larger than the pressing tip 30 described above is utilized in conjunction with a heater 34. The heater 34 is held in contact with the underside of the circuit board 4 to heat the solder bumps 25, 26. The pressing tip 35 is positioned above the circuit board 4. Then, as shown in FIG. 13, both the solder bumps 25, 26 are crushed simultaneously by the pressing tip 35 while they are heated from below with the heater 34.

In this case, the peripheral portion 25a of one solder bump 25 and the peripheral portion 26a of the other solder bump 26 are simultaneously pressed or spread outward in the radial direction so as to approach and contact with each other. As the solder bumps 25, 26 contact with each other, the leads 15a, 15b are shorted together or between them and the circuit including the MR magnetic head device 8 is formed into a closed circuit.

When crushing the solder bumps 25, 26 by the larger pressing tip 35 and the heater 34, the heating temperature and the heating time are preferably set in accordance with the above-described methods.

Moreover, when crushing the solder bumps 25, 26 by any of the above-described methods (i.e., with the pressing tip 30, the heater tip 33, or the combination of the pressing tip 35 and the heater 34, as shown in FIGS. 6 to 13), the solder bumps 25, 26 are preferably crushed while the tips 30, 33, or 35 are moved in a rubbing fashion with respect to the solder bumps in the planar direction of the circuit board 4. This rubbing improves or increases the spreading of the solder bumps 25, 26 in the planar direction of the circuit board 4 during the step of crushing, thereby increasing the positive contacted between the solder bumps 25, 26.

With the magnetic head 1 described above, the MR magnetic head device 8, the lead lines 5a, 5b and the leads 15a, 15b cooperatively construct a circuit, and one pair of the solder bumps 25, 26 connected to the leads 15a, 15b are crushed successively or simultaneously so as to contact with each other. The leads 15a, 15b are thereby shorted between them to make the constructed circuit become a closed circuit. As a result, the MR magnetic head device 8 can be protected against electrostatic breakdown.

With the above-described method of manufacturing the magnetic head 1, the circuit including the MR magnetic head device 8 can be easily formed into a closed circuit by merely crushing the solder bumps 25, 26.

Also, with the above-described method of manufacturing the magnetic head 1, the solder is softened by heating when the solder bumps 25, 26 are crushed. Therefore, the load required for crushing the solder bumps 25, 26 is reduced and the solder bumps 25, 26 can be positively crushed without damaging the circuit board 4.

Further, since the solder bumps 25, 26 are crushed to an extent that a part of the peripheral portion 26a of the other solder bump 26 overlaps the peripheral portion 25a of one solder bump 25, the contact area between the solder bumps 25, 26 is increased and one pair of the leads can be more positively or securely shorted together or between them. As a result, the circuit including the MR magnetic head device 8 can be formed into a closed circuit. Since the peripheral portions 25a, 26a are overlapped with each other, the solder bumps 25, 26 are avoided from separating off, for example, even when the circuit board 4 is bent.

Furthermore, with the above-described method of manufacturing the magnetic head 1 by crushing one pair of the solder bumps 25, 26 while being heated, the load required for crushing the solder bumps 25, 26 is reduced and the solder bumps 25, 26 can be positively contacted with each other even though both the solder bumps are crushed at the same time, without damaging the circuit board 4 when the solder bumps are crushed.

In addition, with the above-described method of manufacturing the magnetic head 1 by crushing the solder bumps 25, 26 in a rubbing fashion, the solder bumps 25, 26 are pressed or spread in the planar direction of the circuit board 4 while being crushed and they can be more positively contacted with each other.

EXPERIMENTAL EXAMPLE 1

A land was formed on a circuit board, and a substantially semispherical solder bump having a diameter of 0.32 mm (320 μm) and a maximum height of 28 μm was formed on the land.

Further, on another circuit board, a substantially semispherical solder bump having a diameter of 0.26 mm (260 μm) and a maximum height of 25 μm was formed in a similar manner to the above. The solder used was made of an SnPb alloy and had the melting point of 183° C.

These solder bumps were each crushed by applying a load of 5–15 kgf, and changes in the bump diameter were measured. Measured results are shown in FIGS. 14 and 15.

Figure 14:
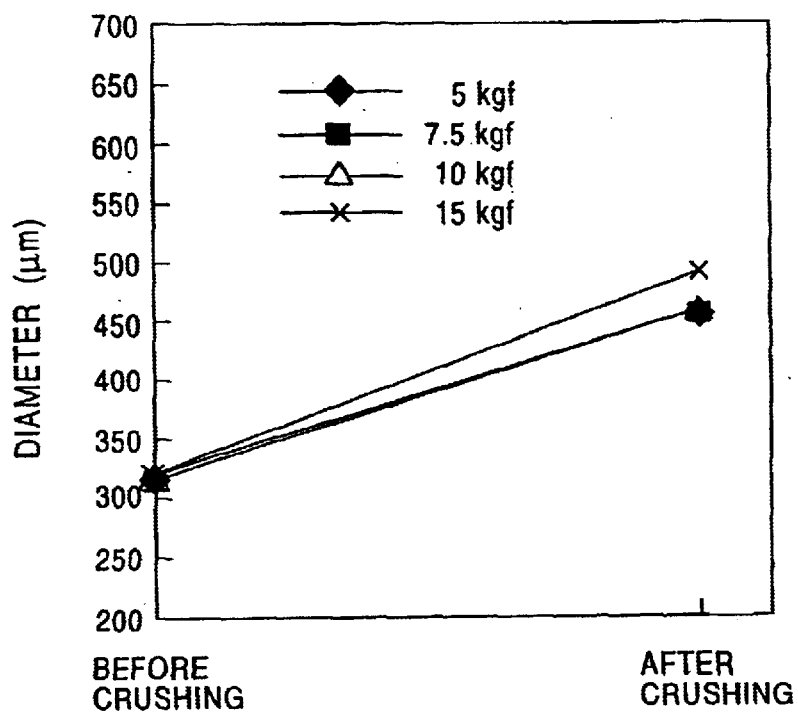
FIG. 14 is a graph showing changes in the diameter of a solder bump when the solder bump is crushed pursuant to an embodiment of the present invention.

As seen from FIG. 14, the diameter of the solder bump having a diameter of 320 μm was changed to 450–490 μm after the crushing.

Figure 15:
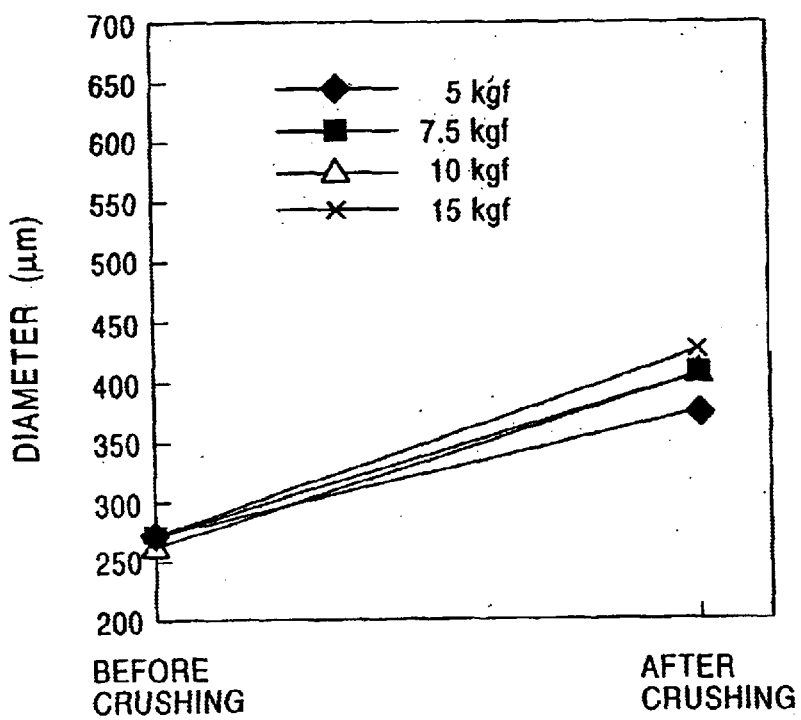
FIG. 15 is a graph showing changes in the diameter of a solder bump when the solder bump is crushed pursuant to an embodiment of the present invention.

Also, as seen from FIG. 15, the diameter of the solder bump having a diameter of 260 μm was changed to 370–430 μm after the crushing.

It is thus understood that, when the solder bump is crushed, the bump diameter is increased and a peripheral portion of the solder bump is pressed or spread outward in the radial direction.

EXPERIMENTAL EXAMPLE 2

Next, a circuit board including one pair of solder bumps, as shown in FIGS. 1 to 3, was fabricated. The solder bumps each had a diameter of 0.32 mm and the center-to-center distance between the solder bumps was 0.4 mm. The solder used was made of an SnPb alloy and had a melting point of 183° C.

First, one solder bump was crushed by heating the solder bump up to 220–260° C. for 1.0–2.5 seconds, under a load of 8 kgf with a heater tip, while the heater tip was moved in rubbing fashion in the planar direction of the circuit board. The other solder bump was then crushed in a similar manner.

Continuity between both the solder bumps was subsequently checked. Checked results are listed in Table 1 and shown schematically in FIGS. 16*a–d*. FIGS. 16*a–d* shows the solder bumps in successive states when crushed while being heated to a temperature of 250° C.

Figure 16A:
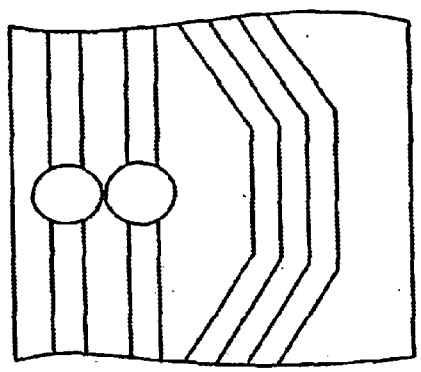
FIGS. 16a–d are schematic views showing a pair of solder bumps in successive states when crushed pursuant to an embodiment of the present invention.

As seen from Table 1 and FIG. 16*a*, when the heating time is 1.0 second at the heating temperature in the range of 170–250° C., the solder bumps are insufficiently crushed and they do not contact with each other. Thus, no electrical conduction is established between the solder bumps.

Figure 16B:
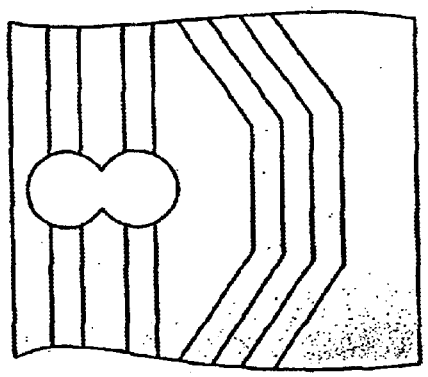
Figure 16C:
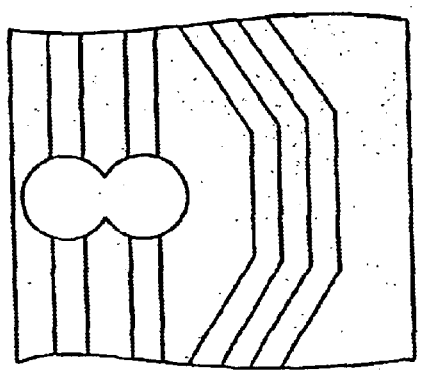
Figure 16D:
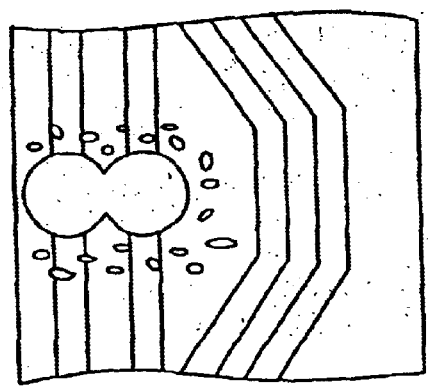
Figure 17:
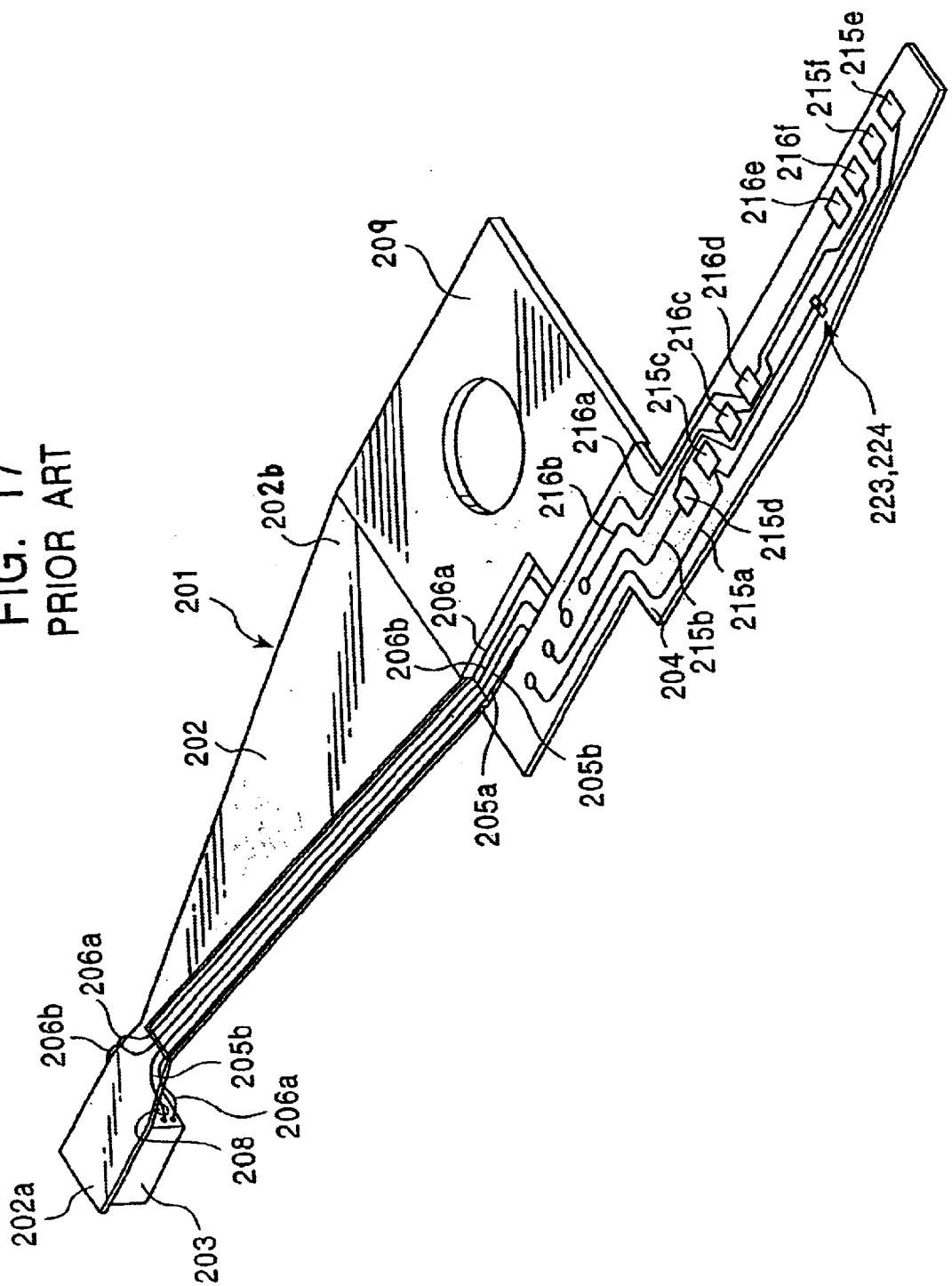
FIG. 17 is a perspective view of a conventional magnetic head.

As seen from FIG. 16*d*, when the heating temperature is higher than 210° C. and the heating time is longer than 2.5 seconds, the soler is excessively melted and a part of the solder is scattered around the solder bumps.

From the above results, it is understood that in order to crush and contact one pair of the solder bumps each having the diameter of 0.32 mm with the center-to-center distance of 0.4 mm, the solder bumps are preferably crushed while being heated to 170–210° C. for 1.5–2.0 seconds (see FIGS. 16*b–c*).

TABLE 1

| Heating Time | Heating Temperature (° C.) | | | | |
| --- | --- | --- | --- | --- | --- |
| (sec) | 170° C. | 180° C. | 190° C. | 200° C. | 210° C. |
| 1.0 sec | no conduction | no conduction | no conduction | no conduction | no conduction |
| 1.5 sec | conduction | conduction | conduction | conduction | conduction |
| 2.0 sec | conduction | conduction | conduction | conduction | conduction |
| 2.5 sec | conduction | conduction | conduction | conduction | conduction |

As fully described above, the circuit board according to the present invention comprises at least a pair of leads and a pair of solder bumps. The solder bumps are arranged in an adjacent relationship and, when the solder bumps are crushed, peripheral portions of the solder bumps are overlapped with each other. Therefore, the leads constructing a circuit can be easily shorted together or between them by merely crushing the solder bumps, and the circuit can be formed into a closed circuit.

Also, the circuit board according to the present invention comprises a solder bridge for electrically interconnecting lands connected to the leads, the solder bridge being formed by the peripheral portions of the solder bumps formed on the lands, which are integrally overlapped with each other. Therefore, the contact area between the solder bumps is increased and the leads can be more positively shorted between them.

In addition, since the peripheral portions of the solder bumps are overlapped with each other, separation of the solder bumps is avoided, for example, even when the circuit board is bent. Therefore, the shorted state between the leads established by the solder bridge is maintained and reliability of the circuit board can be increased.

The circuit shorting method according to the present invention comprises the steps of crushing one of the solder bumps such that a peripheral portion of the one solder bump is pressed or spread outward in the radial direction to approach the other solder bump; and then crushing the other solder bump such that a peripheral portion of the other solder bump is pressed or spread outward in the radial direction to contact with the peripheral portion of the first solder bump, whereby the pair of leads are shorted. As a result, the circuit can be positively formed into a closed circuit.

Also, in the circuit shorting method according to the present invention, the step of crushing the other solder bump is performed until a part of the peripheral portion of the other solder bump overlaps the peripheral portion of the first solder bump. Therefore, a contact area between the solder bumps is increased and the leads can be positively shorted between them.

Further, in the circuit shorting method according to the present invention, the solder bumps are crushed while being softened under heating. Therefore, the load required for crushing the solder bumps is reduced and the solder bumps can be positively crushed without damaging the circuit board itself.

Moreover, in the circuit shorting method according to the present invention, the solder bumps are crushed simultaneously while being softened under heating. Therefore, the load required for crushing the solder bumps is reduced and the solder bumps can be positively contacted with each other even when they are crushed simultaneously. Damage of the circuit board is therefore avoided at the time of crushing the solder bumps.

Additionally, in the circuit shorting method according to the present invention, the solder bumps are each crushed under heating and rubbing. Therefore, each solder bump is pressed or spread in the planar direction of the circuit board while being crushed, and the solder bumps can be more positively contacted with each other.

In the magnetic head according to the present invention, a slider including an MR magnetic head device is attached to a fore end of a load beam, the above-mentioned circuit board is attached to an opposite end of the load beam, and a pair of lead lines extended from the MR magnetic head device are connected to the circuit board. The MR magnetic head device, the lead lines and the leads cooperate to construct or form a circuit. A pair of solder bumps connected to the leads are then crushed successively to be contacted with each other, whereby the leads are shorted together or between them and the circuit is formed into a closed circuit. As a result, the MR magnetic head device can be protected against electrostatic breakdown.

Also, the magnetic head according to the present invention includes a circuit board which comprises at least a solder bridge for electrically interconnecting lands connected to the leads, the solder bridge being formed by peripheral portions of the solder bumps formed respectively on the leads and overlapped with each other. Therefore, the contact area between the solder bumps is increased and the leads can be positively shorted together or between them so that the circuit including the MR magnetic head device is formed into a closed circuit.

In addition, since the peripheral portions of the solder bumps are overlapped with each other, separation of the solder bumps is avoided, for example, even when the circuit board is bent. Therefore, the shorted state between the leads established by the solder bridge is maintained to prevent electrostatic breakdown of the MR magnetic head device, and reliability of the circuit board can be increased.

Furthermore, with the method of manufacturing a magnetic head according to the present invention, the circuit including the MR magnetic head device can be easily formed into a closed circuit by merely crushing the solder bumps, and the MR magnetic head device can be protected against electrostatic breakdown.

What is claimed is:

1. A circuit board comprising at least a pair of leads for constructing a circuit, lands connected respectively to said pair of leads, and solder bumps formed respectively on said lands, wherein a center-to-center distance between said solder bumps is in a range of 0.39 to 0.41 mm, said solder bumps are crushed, and peripheral portions of said solder bumps are spread to overlap with each other.

2. The circuit board according to claim 1, wherein each of the solder bumps has a diameter of 0.29 to 0.34 mm.

3. The circuit board according to claim 1, further comprising a mounting terminal and an inspection terminal formed on the same surface of the circuit board on which the solder bumps are formed, wherein one end of each lead is connected to an element;

the mounting terminal is disposed between the element and the solder bumps; and the inspection terminal is formed remote from the mounting terminal.

4. A circuit board comprising at least a pair of leads for constructing a circuit, lands connected respectively to said pair of leads, and solder bumps formed respectively on said lands, wherein a peripheral portion of one of said solder bumps overlaps a peripheral portion of the other solder bump, thereby connecting the solder bumps with each other.

5. The circuit board according to claim 2, further comprising a mounting terminal and an inspection terminal formed on the same surface of the circuit board on which the solder bumps are formed, wherein one end of each lead is connected to an element;

the mounting terminal is disposed between the element and the solder bumps; and the inspection terminal is formed remote from the mounting terminal.

* * * * *